United States Patent [19]

Sakai

[11] Patent Number: 4,727,580

[45] Date of Patent: Feb. 23, 1988

[54] RADIO RECEIVER

[75] Inventor: Tsuneo Sakai, Iwaki, Japan

[73] Assignee: Alpine Electronics, Inc., Japan

[21] Appl. No.: 8,622

[22] Filed: Jan. 29, 1987

[30] Foreign Application Priority Data

Apr. 23, 1986 [JP] Japan .................................. 61-94074
Apr. 23, 1986 [JP] Japan .............................. 61-61347[U]
Apr. 23, 1986 [JP] Japan .............................. 61-61348[U]

[51] Int. Cl.$^4$ ............................................. H04H 5/00
[52] U.S. Cl. ........................................ 381/7; 381/13; 329/112; 329/147
[58] Field of Search ............... 329/107, 112, 126, 147; 381/7, 13

[56] References Cited

U.S. PATENT DOCUMENTS 3,974,453  8/1976  Ohsawa .............................. 329/112
4,612,510  9/1986  Lawton .............................. 329/126

Primary Examiner—Forester W. Isen
Attorney, Agent, or Firm—Guy W. Shoup

[57] ABSTRACT

A radio receiver most suitable for use in a car includes a pulse count demodulating circuit and a second demodulating circuit other than a pulse count detecting circuit so that a demodulation signal from selected one of the demodulating circuits is supplied according to the level of a detection signal supplied from a received electric field intensity detecting circuit.

4 Claims, 8 Drawing Figures

RADIO RECEIVER

FIELD OF THE INVENTION

This invention relates to a radio receiver most suitable for use in a car.

BACKGROUND OF THE INVENTION

In some prior art FM radio receivers in home-use audio systems, a pulse count demodulating circuit is employed as its demodulating means.

The pulse count demodulating circuit is configured to change an FM wave to a rectangular wave signal, with its upper and lower peaks removed by a limitter, and to produce a rectangular wave which is equal in the rising phase to the former rectangular wave and always uniform in the width from the rising and dropping, so as to subsequently integrate the rectangular wave by an integrating circuit and produce an audio signal.

The pulse count demodulating circuit is low in distortion and high in signal-to-noise (S/N) ratio when the electric field intensity of the received wave is higher than a predetermined level. For this reason, the use of the pulse count demodulating circuit has been recently increased in FM radio receivers in home-use audio systems.

The pulse count demodulating circuit, however, cannot effect its demodulating function and rather produces a large noise when the received electric field intensity is weak. In some home-use audio systems, hard muting is employed to prevent noises. However, hard muting is not suitable in automobile radio receivers including the pulse count demodulating circuit, because due to frequent changes in the received electric field intensity in a car radio receiver, hard muting will be often effected every time when the received electrical field intensity drops below a predetermined level, and will hardly provide sufficiently continuous reproduced audio sound.

This is the reason why the prior art could not use the pulse count demodulating circuit in automobile radio receivers.

OBJECT OF THE INVENTION

It is therefore an object of the invention to provide a radio receiver including a pulse count demodulating circuit which is operative in a bad condition such as in a car subject to frequent changes in the received electric field intensity.

A further object of the invention to provide a radio receiver including a pulse count demodulating circuit and another demodulating circuit which are selectively activated according to the received electric field intensity to reproduce an audio sound excellent in distortion factor and S/N ratio.

A still further object of the invention is to provide a radio receiver in which a difference, i.e. a hysteresis is provided between the level to change the demodulating method from one to the other and the level to change the demodulating method vice versa.

A yet further object of the invention to provide a radio receiver including a noise removing circuit which removes engine noises and other pulsive noises, the noise detecting sensitivity of the noise elimination circuit being selectively changed according to the received electric field intensity, i.e. a selected demodulating method, to establish the best noise removing configuration for the selected demodulating method.

A yet further object of the invention to provide a radio receiver including a separation circuit and a high-cut circuit which are selectively activated according to the selected demodulating method so as to improve the S/N ratio against a poor magnitude of the received electric field intensity.

SUMMARY OF THE INVENTION

FIG. 1 shows the most basic feature of a radio receiver according to the invention. Reference numeral 3 refers to an intermediate frequency (IF) amplifier, 15 to a switching circuit, 16 to a switching level control circuit, 17 to a noise elimination circuit, 18 to a stereo demodulating circuit, 19 to a noise elimination circuit controller, 20 to a separation/high-cut controller, 25 to a detecting circuit for detecting the received electric field intensity, 26 to a first demodulating circuit which is a pulse count demodulating circuit, and 27 to a second demodulating circuit other than a pulse count demodulating circuit.

In a sufficient received electric field intensity, the pulse count demodulating circuit 26 is superior in distortion factor and S/N ratio to the other demodulating circuit, e.g. a ratio demodulating circuit 27. In a weak received electric field intensity, the ratio demodulating circuit 27 is superior.

Therefore, when the detecting circuit 25 detects that the received electric field intensity increases to or above a predetermined level, the switching circuit 15 supplies a demodulation signal $DM_P$ from the pulse count demodulating circuit 26. When the received electric field intensity drops to or below a predetermined level, the switching circuit 15 is activated to supply a demodulation signal $DM_R$ from the ratio demodulating circuit 27.

A hysteresis is provided between a first switching level to supply the demodulation signal $DM_P$ from the pulse count demodulating circuit 26 upon an increase of the received electric field intensity and a second switching level to supply the demodulation signal $DM_R$ from the ratio demodulating circuit 27. More specifically, the switching level control circuit 16 switches the switching circuit 15 so that the demodulation signal $DM_P$ is supplied from the pulse count demodulating circuit 26 when the received electric field intensity reaches or exceeds the first level, whereas the demodulation signal $DM_R$ is supplied from the ratio demodulating circuit 27 when the received electric field intensity drops to or below the second level which is lower than the first level.

A demodulation signal (composite signal) $S_{DT}$ supplied from the switching circuit 15 is entered in the noise elimination circuit 17 which removes pulsive noises and produces a resulting signal.

The noise elimination circuit controller 19 changes the noise detection sensitivity of the noise elimination circuit 17 according to the received electric field intensity, i.e. selected one of the demodulating methods, so as to establish the best noise removal configuration for removing noises involved in the demodulation output.

The demodulation signal (stereo demodulation signal) $S_{DT}$ supplied through the switching circuit 15 is entered in the stereo demodulating circuit 18 via the noise removal circuit 17, and is divided therein into an L(left)-channel signal LAS and an R(right)-signal RA.

The separation/high-cut controller 20 switches the degree of the channel separation by the stereo demodulating circuit 18 and the high-cut operation (high-band component attenuation) of L-channel and R-channel signals from the stereo demodulating circuit according to selected one of the detecting methods. For example, while the switching circuit 15 supplies the pulse count demodulator output under a high received electric field intensity, the channel separation and high-cut operation are suppressed to the smallest degree. When the ratio demodulator output is supplied under a weak received electric field intensity, adequate channel separation and high-cut operations are effected in accordance with the received electric field intensity.

DETAILED DESCRIPTION

Figure 1:
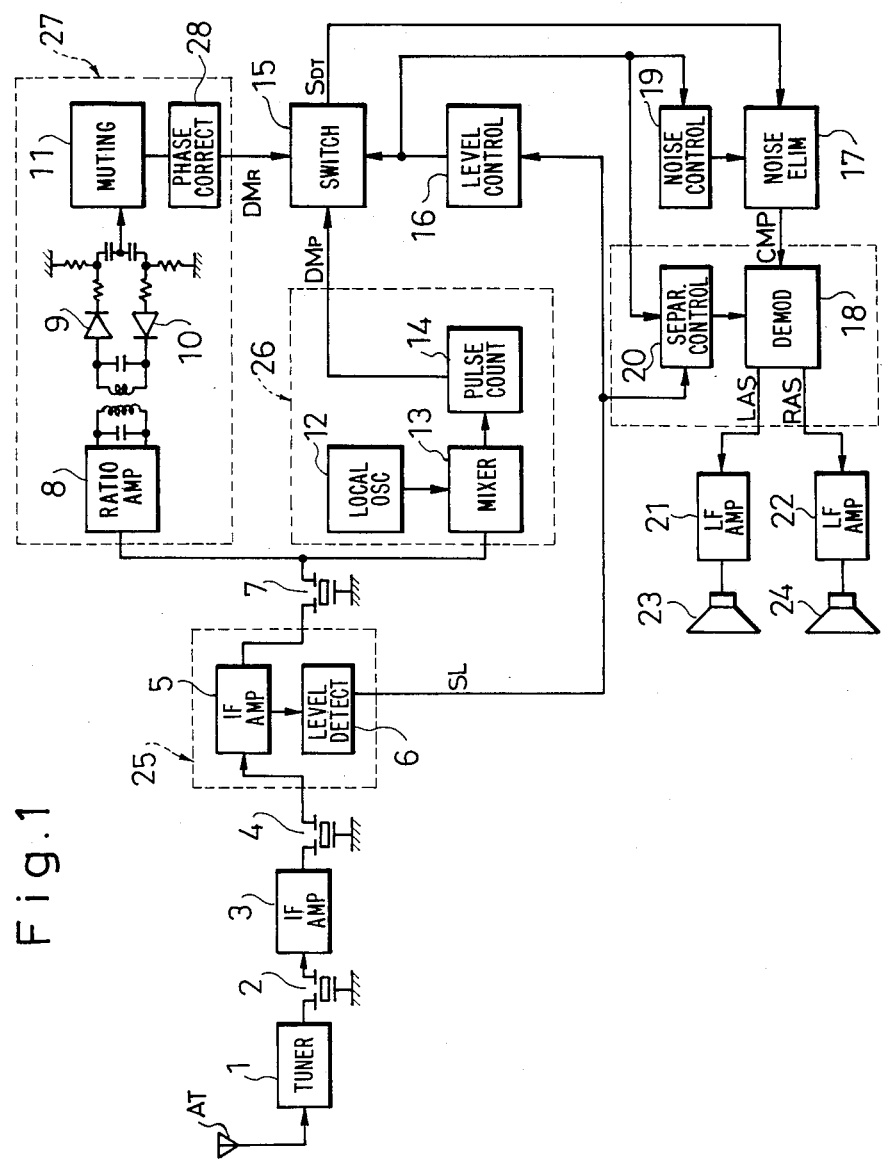
FIG. 1 is a block diagram of a radio receiver embodying the invention.

The invention is hereinbelow described in detail, referring to a preferred embodiment illustrated in the drawings.

In FIG. 1 which is a block diagram of a radio receiver embodying the invention, reference numeral or symbol AT refers to an antenna, 1 to a front end (tuner) 2, 4 and 7 to ceramic filters, 3 and 5 to intermediate frequency amplifiers, 6 to a level detector which detects the received electric field intensity, 8 to a ratio amplifier, 9 and 10 to demodulation diodes, 11 to a soft muting circuit, 12 to a local oscillator, 13 to a mixer, 14 to a pulse count demodulator, 15 to a switching circuit, 16 to a switching level control circuit, 17 to a noise elimination circuit, 18 to a stereo demodulating circuit, 19 to a noise elimination circuit controller, 20 to a separation/high-cut controller, 21 and 22 to low frequency amplifiers, 23 and 24 to speakers, 25 to an intermediate demodulation block (detecting circuit), 26 to a pulse count demodulation block, 27 to a ratio demodulation block, and 28 to a phase correction circuit.

The demodulation block 25 consists of the IF amplifier 5 and level detector 6 and is configured to apply an FM signal from the IF amplifier 5 to the demodulation blocks 26 and 27. The level detector 6 supplies a signal SL (called "level meter output") having a level corresponding to the received electric field intensity.

The pulse count demodulation block 26 is a first demodulating circuit which includes the local oscillator 12, mixer 13 and pulse count demodulator 14.

The ratio demodulation block 27 is a second demodulating circuit which includes the ratio amplifier 8, demodulation diodes 9 and 10 (they all form a ratio demodulator), soft muting circuit 11, phase correction circuit 28 and others. The phase correction circuit 28 meets the phase difference in the ratio demodulation block with the phase difference in the pulse demodulation block.

The outputs of the demodulation blocks 26 and 27 are connected to the switching circuit 15.

Figure 2:
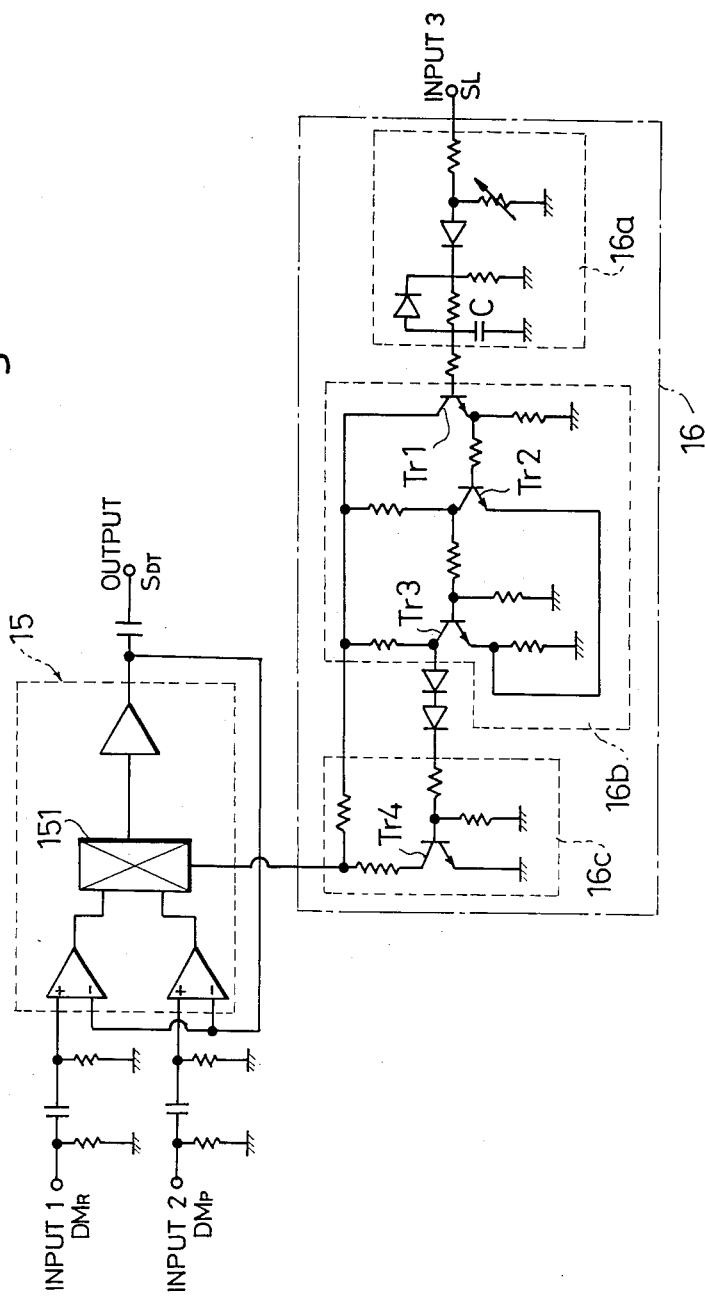
FIG. 2 is a circuit arrangement of a switching circuit and switching level control circuit involved in FIG. 1.

The switching circuit 15, as shown in FIG. 2, includes an electronic switch (analogue switch) 151, an input terminal INPUT 1 including a filter which receives a demodulation output $DM_R$ from the ratio demodulating block 27 and an input terminal INPUT 2 including a filter which receives a demodulation output $DM_P$ from the pulse count demodulating block 26. The electronic switch 151 selectively allows the signal $DM_R$ from the input terminal INPUT 1 and the signal $DM_P$ from the input terminal INPUT 2 to pass through the output terminal OUTPUT. The signal selection of the electronic switch 151 is controlled by the switching level control circuit 16.

The switching level control circuit 16 includes a time constant circuit 16a immediately downstream of its input terminal INPUT 3. The time constant circuit 16a consists of a capacitor C and resistors. The switching level control circuit 16 further includes a Schmitt trigger circuit 16b and a switching circuit 16c downstream of the time constant circuit 16a. The switching circuit 16c has a transistor Tr4 the collector of which is connected to a control terminal of the electronic switch 151. With this arrangement, the switching level control circuit 16 causes the electronic switch 151 to connect the input terminal INPUT 2 to the output terminal OUTPUT when the level meter output SL entered in the input terminal INPUT 3 reaches or exceeds a first level (see the antenna input level L1 of FIG. 3) for a predetemined time or more, and connect the input terminal INPUT 1 to the output terminal OUTPUT when the level meter output SL drops to or below a second level (which is smaller than the first level. See the antenna input level L2 of FIG. 3.) for a predetermined time or more.

Figure 3:
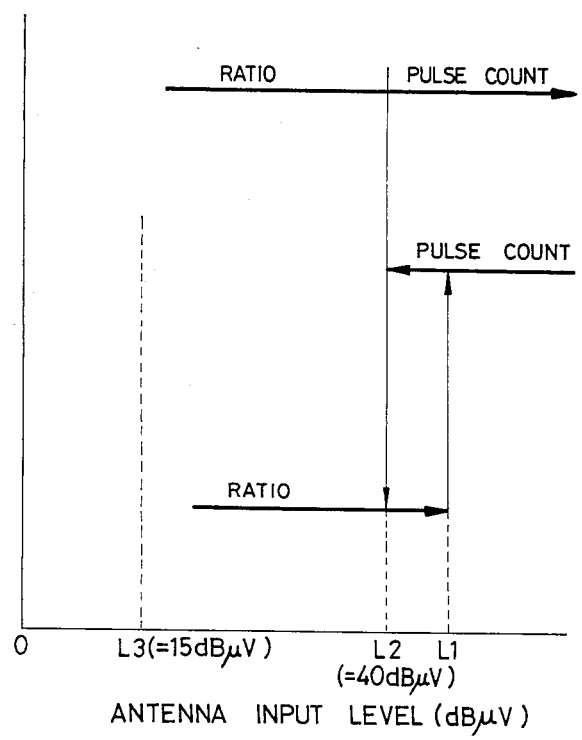
FIG. 3 is a graph for explanation of switching levels.

The first and second levels L1 and L2 are larger than the minimum level for the use of a pulse count demodulating circuit (the minimum level is shown in FIG. 3 as the antenna input level L3 of 15 $dB_\mu V$ approximately). For example, the second level L2 is 40 $dB_\mu V$.

The demodulation output $S_{DT}$ from the switching circuit 15 is entered in the noise elimination circuit 17 in which pilot signals or pulsive noises are removed, and the resulting signal is entered in the stereo demodulating circuit 18. The noise elimination circuit controller 19 changes the noise detection sensitivity of the noise elimination circuit 17 according to the received electric field intensity, i.e. the selected detection method, to select the best sensitivity and other conditions.

Figure 4:
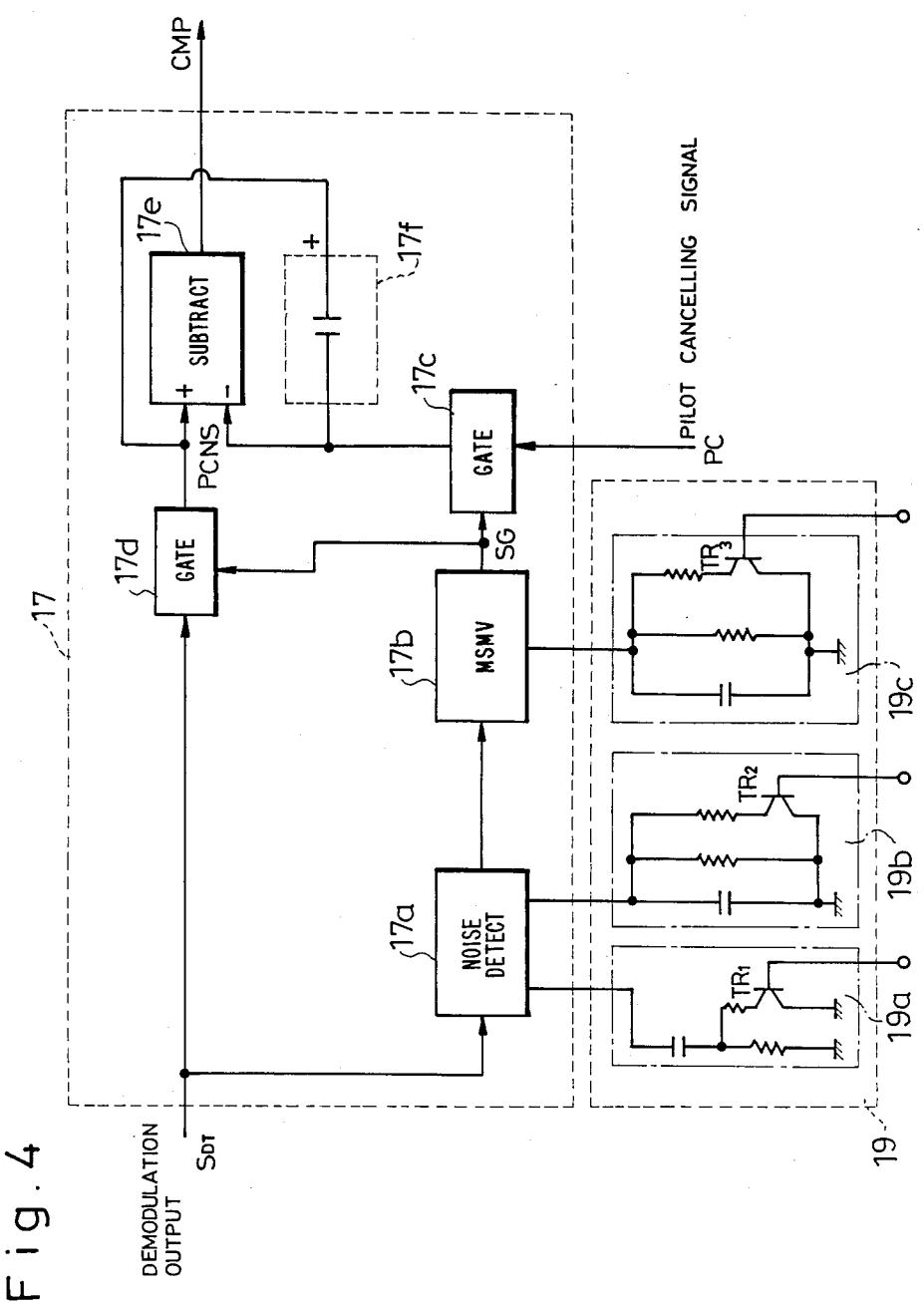
FIG. 4 is a block diagram of a noise removal circuit and noise removal circuit controller.
Figure 5:
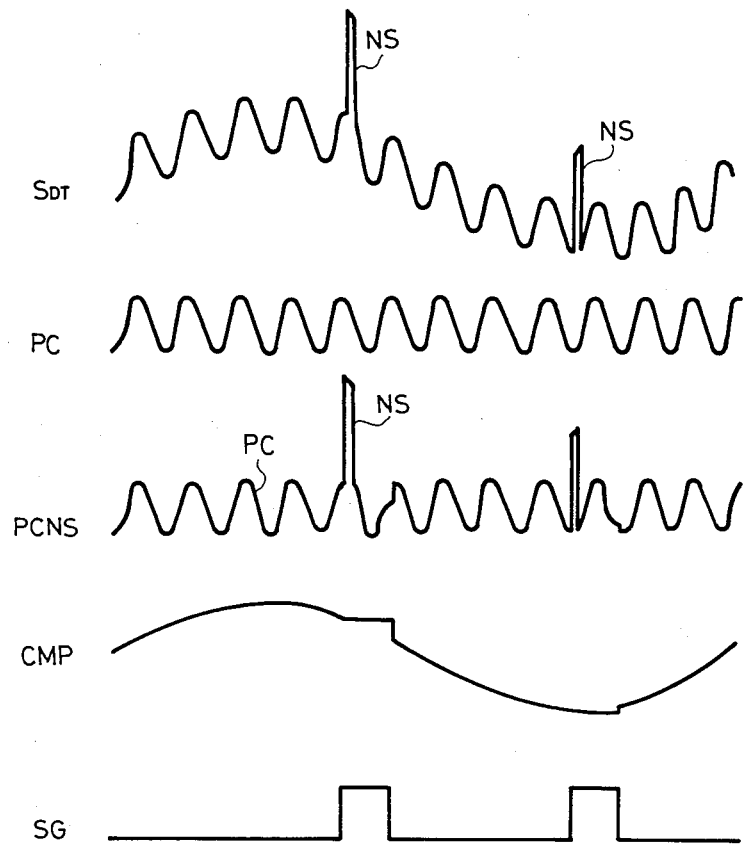
FIG. 5 shows waveforms at various points of FIG. 4.

FIG. 4 is a block diagram of the noise eliminating circuit and noise elimination circuit controller. FIG. 5 shows waveforms at various points of the circuit of FIG. 4.

The noise eliminating circuit 17 includes a noise detection circuit 17a which detects pulsive noises NS involved in the detection output $S_{DT}$; a mono-stable multivibrator 17b which produces a gate control pulse $S_G$ for a predetermined time upon noise detection; gate circuits 17c and 17d which are normally opened but closed upon reception of the gate control pulse $S_G$; a subtracter which effects subtraction of analogue signals; and a memory circuit 17f which includes a capacitor storing the preceding demodulation output level.

The operation of the noise elimination circuit 17 is hereinbelow explained, assuming that the demodulation output $S_{DT}$ merely includes a low frequency signal and a pilot signal but no other component, and that a pilot signal cancelling signal PC is equal in phase and amplitude to the pilot signal in the demodulation output.

An output signal CMP of the noise elimination circuit 17 is a difference voltage between the sum input and subtraction input of the subtracter 17e, and equals to an inter-terminal voltage of the capacitor in the memory circuit 17f.

When both gates 17c and 17d are opened in absence of noises, the sub terminal of the subtracter 17e receives the demodulation output $S_{DT}$, and the subtraction terminal receives the pilot cancelling signal PC, so that a low frequency signal not including the pilot signal appears at the output terminal (see the output signal CMP of FIG. 5). The capacitor terminal voltage of the memory circuit 17f is the difference voltage between the demodulation output $S_{DT}$ and the pilot cancelling circuit PC, too, and the difference voltage is stored in the capacitor.

In this configuration, when a noise NS is produced, it appears at the subtraction terminal of the subtracter 17e through the capacitor of the memory circuit 17f, and the output terminal of the subtracter 17e produces an output signal CMP not including the noise. The reason why the noise appears at the subtraction terminal is that the capacitor is alternatingly changed to a short circuit configuration due to a significantly large input impedance of the subtracter 17e.

In parallel to the noise eliminating operation, the noise NS is detected by the noise detecting circuit 17a and causes the mono-stable multivibrator 17b to produce the gate control pulse $S_G$ for a predetermined time to close the gates 17c and 17d. As the result, the sum terminal of the subtracter 17e thereafter receives a voltage which had been charged in the capacitor of the memory circuit 17f before the noise was produced, and supplies the voltage in the unchanged form (see the output signal CMP in FIG. 5).

The noise elimination circuit controller 19 includes a noise detection sensitivty switcher 19a which changes the noise detection sensitivity of the noise elimination circuit 17 according to the received electric field intensity, i.e. the selected demodulating method; a noise AGC adjuster 19b which adjusts the noise AGC according to the selected demodulating method; and a pulse width adjuster 19c which adjusts the pulse width of the gate control pulse $S_G$ according to the selected demodulating method. These members 19a through 19c each consist of resistors and a capacitor connected in series or parallel to control the noise detection sensitivity, noise AGC and pulse width by on-off action of the transistors TR1 through TR3 according to the selected demodulating method. For example, when the pulse count demodulation output is supplied from the switching circuit 15 upon an increase in the received electric field intensity, they establish a high noise detection sensitivity, a large gain of the noise AGC and a small pulse width of the gate control pulse. When the switching circuit 15 supplies the ratio demodulation output upon a decrease in the received electric field intensity, they establish the opposite controlled configuration.

The separation/high-cut controller 20 switches the channel separation ratio of the stereo demodulating circuit 18, and the high-cut operation (attenuation of high band components) of the L-channel and R-channel signals LAS and RA produced from the stereo demodulating circuit 18 according to the selected demodulating method. For example, when the pulse count demodulation output $DM_P$ is selected and supplied from the switching circuit 15 to serve as the stereo demodulating signal $S_{DT}$ upon an increase in the received electric field intensity, the channel separation and high-cut operations are interrupted or suppressed to the minimum degrees. When the ratio demodulation output $DM_R$ is selected and supplied as the stereo demodulating signal $S_{DT}$ upon a drop in the received electric field intensity, appropriate channel separation and high-cut operation are effected according to the received electric field intensity.

Figure 6:
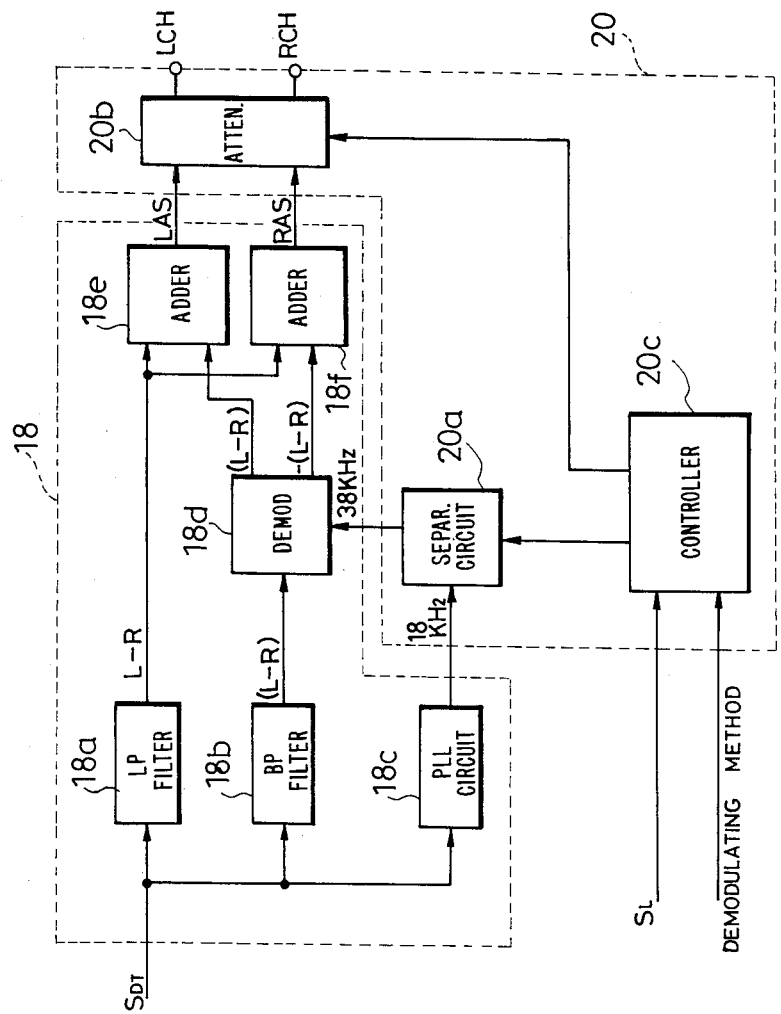
FIG. 6 is a block diagram of a stereo demodulating circuit and separation/high-cut controller.

FIG. 6 is a block diagram of the stereo demodulation block including the stereo demodulating circuit 18 and including the separation/high-cut controller 20.

The stereo demodulating circuit 18 includes a low pass filter 18a which separates and supplies a stereophonic major channel signal (L+R); a band pass filter 18b which effects amplitude modulation based on a difference signal (L−R) and separates and supplies a stereo sub-channel signal (L−R) cos$\omega_s$t which is a lateral band signal with its sub-carrier being suppressed; a PLL circuit 18c which extracts the pilot signal of 19 kHz involved in the stereo demodulating signal $S_{DT}$; a sub-channel demodulating circuit 18d which receives a sub-carrier signal of 38 kHz and a stereo sub-channel signal to supply a positive difference signal (L−R and a negative difference signal −(L−R); an adder 18e which sums a sum signal (L+R) and the positive difference signal (L−R) to produce an L-channel signal LAS; and an adder 18f which sums the sum signal (L+R) and the negative difference signal −(L−R) to produce an R-channel signal RA.

The separation/high-cut controller 20 includes a separation circuit 20a which multiplies the pilot signal of 18 kHz from the PLL circuit 18c to produce a sub-carrier of 38 kHz and also change the demodulating level of the sub-carrier to control the degree of the channel separation; a high-cut circuit 20b which attenuates high band components (higher than 7 kHz, for example) of the L-channel signal LAS and R-channel signal RAS; and a controller 20c which controls the operations of the separation circuit 20a and high-cut circuit 20b according to the selected demodulating method and level meter output SL.

The operation of the separation/high-cut controller 20 is hereinbelow explained.

When the pulse count demodulation output is supplied as the stereo demodulating signal $S_{DT}$ from the switching circuit 15 during a sufficient magnitude of the received electric field intensity, the S/N ratio and distortion factor are good, and no channel separation control nor high-cut control is required for improvement of the S/N ratio. Therefore, the controller 20c receives a signal representing the presently selected demodulating method from the switching level control circuit 16, and if it is the pulse count demodulating method, the controller 20c stops the high component attenuation of the high-cut circuit 20b and stops the separation control of the separation circuit 20a, so that the sub-carrier signal level of 38 kHz is applied to the sub-channel demodulating circuit 18d in its not-controlled, unchanged form. The separation/high-cut controller 20 may be designed so that the circuits 20a and 20b do not stop their separation and high-cut operations but effect their minimum separation and high-cut operations.

When the ratio demodulation output is supplied as the stereo demodulation signal $S_{DT}$ from the switching circuit 15 upon a drop in the received electric field intensity, some improvements are required in the S/N ratio and distortion factor. The controller 20c receives a signal representing the presently selected demodulating method from the switching level control circuit 16, and if it is the ratio demodulating method, it activates the separation circuit 20a and high-cut circuit 20b to effect their separation control and high-cut control according to the received electric field intensity (level meter output SL). More specifically, during the ratio demodulation, the separation circuit 20a effects its separation control operation when the level meter output is in the range from 20 dBµV through 40 dBµV to change the signal level of the sub-carrier of 38 kHz and apply it to the sub-channel demodulating circuit 18d for control of the channel separation degree. As the result, the S/N ratio is improved in a weak electric field (20–40 dBµV). When the level meter output is in the range of 7 through 20 dBµV during the ratio demodulation, the separation circuit 20a stops its separation control operation, and the high-cut circuit 20b is activated to eliminate high band components higher than 7 kHz in the respective channel signals. Beside this, an IF muting is effected when the level meter output drops to or below 7 dBµV.

The operation of the entire radio receiver is hereinbelow described, referring to FIG. 1.

A signal supplied from a desired station and received by the antenna AT is converted to an intermediate frequency signal in the front end 1, and entered in the IF amplifier 3 via the ceramic filter 2 for amplification. An output signal from the IF amplifier 3 is entered in the IF amplifier 3 via the ceramic filter 2 for amplification. An output signal from the IF amplifier 3 is entered in the IF amplifier 5 in the subsequent stage via the ceramic filter 4 for amplification therein. At this time, a leval meter output SL is extracted from the IF amplifier 5 via the level detector 6.

The output signal from the IF amplifier 5 is entered in the pulse count demodulation block 26 and ratio demodulation block 27 via the ceramic filter 7, and the blocks 26 and 27 apply their demodulation signals DM$_P$ and DM$_R$ to the switching circuit 15.

Figure 7:
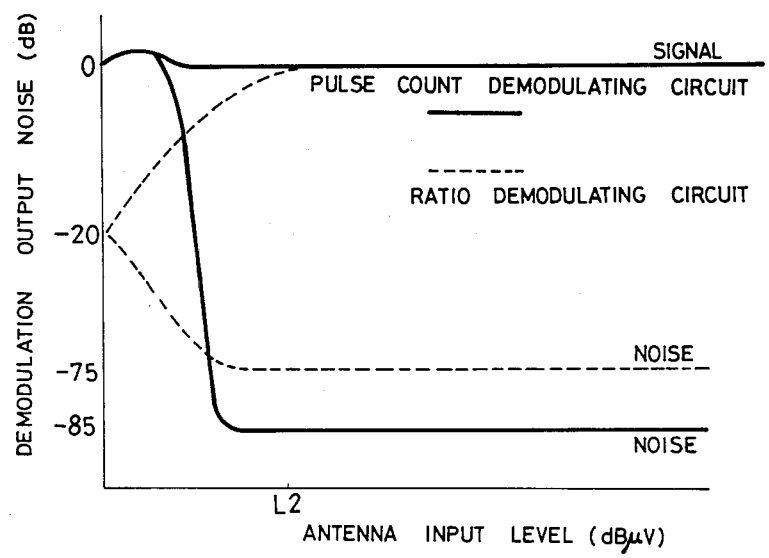
FIG. 7 shows changes in the S/N ratio with antenna inputs.

The level meter output SL from the level detector 6 is applied to the switching level control circuit 16 which switchingly activates the switching circuit 15 to supply the demodulation signal DM$_P$ from the pulse count demodulation block 26 when the received electric field intensity reaches or exceeds the first level L1 (see FIG. 3) for a predetermined time, and otherwise produce the demodulation signal DM$_R$ from the ratio demodulation block 27 when the received electric field intensity drops to or below the second level L2 (<L1. See FIG. 3.) for a predetermined time. The S/N ratio by the pulse count demodulating method represents a rapid degradation in a weak electric field intensity. However, the S/N ratio by the ratio demodulating method merely represents a modest degradation in a weak electric field intensity and is better than the S/N ratio by the pulse count demodulating method (see the S/N ratio curves in FIG. 7).

Figure 8:
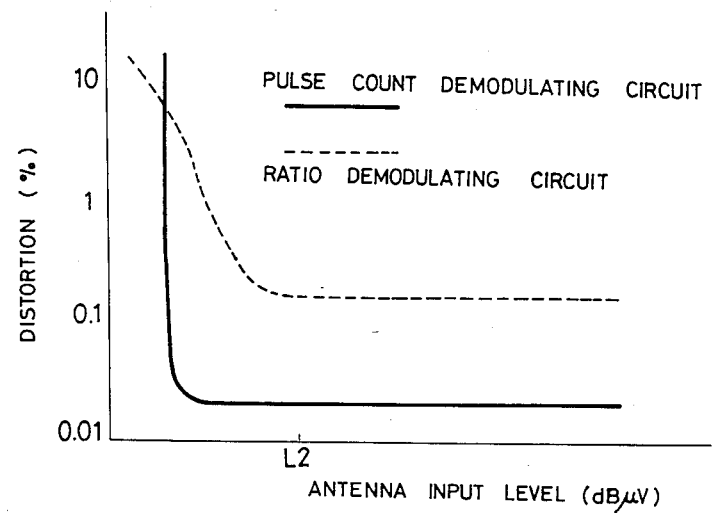
FIG. 8 shows changes in the distortion factor with antenna inputs.

Similarly, the distortion factor by the pulse count demodulating method represent a rapid deterioraton in a weak electric field intensity. However, the distortion factor by the ratio demodulating method represents a modest deterioration in a weak electric field intensity and is better than the distortion factor by the pulse count demodulating method (see the distortion factor curves in FIG. 8).

The demodulation signal S$_{DT}$ which was automatically selected and supplied by the switching circuit in accordance with the received electric field intensity is applied to the noise elimination circuit 17 where pilot signals and pulsive noises are removed therefrom. The noise elimination circuit controller 19 is connected to the switching level control circuit 16 to change the noise eliminating condition of the noise elimination circuit 17 according to the presently selected demodulating method.

After this, the output signal from the noise elimination circuit 17 is entered in the stereo demodulating circuit 20 which processes the entered stereo demodulation signal to produce an L-channel signal LAS and an R-channel signal RAS. These channel signals are entered in the right and left speakers 23 and 24 via the right and left channel low frequency amplifiers 21 and 22 and are supplied as audio sound from the speakers.

The separation/high-cut controller 20 changes the degree of the channel separation of the stereo demodulating circuit 18 and the high-cut operation (attenuation of high band components) of the L-channel and R-channel signals supplied from the stereo demodulating circuit according to the selected demodulating method as explained above with reference to FIG. 6. More Specifically, when the pulse count demodulation output is selected and supplied from the switching circuit 15 while the received electric field intensity is high, the channel separation and high-cut operation are interrupted or suppressed to the minimum degrees. When the ratio demodulation output is selected and supplied, the channel separation and high-cut control are appropriately effected in accordance with the received electric field intensity. Due to this, the best control configuration is always established according to the selected demodulating method, focusing at the sound quality during supply of the pulse count demodulation signal and focusing at a comfortable sound during supply of the ratio demodulation signal.

In this manner, the invention radio receiver never fails to reproduce audio sounds excellent in distortion factor and S/N ratio regardless of a bad condition subject to frequent changes in the received electric field intensity. Beside this, due to the hysteresis in the switching levels for changing the demodulating method, the radio receiver does not effect frequent changes of the demodulating method regardless of fluctuation of the received electric field intensity around the switching levels, and minimized uncomfortable disconnection in the reproduced sound.

The second demodulating circuit may be a PLL demodulating circuit or a quadrature demodulating circuit instead of the ratio demodulating circuit.

The hysteresis is not indispensable to reproduce audio sounds sufficiently excellent in the distortion factor and S/N ratio. As described, the invention system is significantly advantageous in various viewpoints some of which are specifically pointed out hereinbelow.

The S/N ratio and distortion factor are significantly improved, using the pulse count demodulating circuit as a demodulating means in a radio receiver of a car subject to frequent changes in the received electric field intensity.

The invention system never fails to improve the S/N ratio and distortion factor during a weak electric field intensity because the pulse count demodulation is replaced by another demodulating method when the received electric field intensity is weak. The provision of the hysteresis in the switching levels of the detecting method prevents frequent changes of the demodulating methods irrespectively of fluctuation of the received electric field intensity around the switching levels, and therefore prevents uncomfortable disconnection in the reproduced sound caused by changes of the demodulating methods.

By using the noise elimination circuit to eliminate engine noises or other pulsive noises under the best noise eliminating conditions including the noise detecting sensitivity of the noise elimination circuit which are established according to the received electric field intensity, i.e. the selected demodulating method, a further improvement of the S/N ratio is expected.

By using the separation circuit and high-cut circuit which are changed in their operating conditions according to the selected demodulating method, the S/N ratio is further improved while the received electric field intensity is weak.

The embodiments of the invention in which an exclusive property or privilege is claimed are defined as follows:

1. A radio receiver for receiving a radio signal comprising:
    means receiving and converting said radio signal into an IF signal;
    a first demodulating circuit which is a pulse count demodulating circuit and a second demodulating circuit other than a pulse count demodulating circuit, both demodulating circuits being responsive to said IF signal;
    a detecting circuit for generating a field strength signal related to the received electric field intensity of said radio signal; and
    a switching circuit selectively outputting a demodulation signal from said first demodulating circuit and a demodulation signal from said second demodulating circuit in response to said field strength signal.

2. A radio receiver of claim 1 further comprising a switching level control circuit which selectively activates said switching circuit to supply said demodulation signal from said first demodulating circuit under a received electric field intensity equal to and higher than a first level and to supply said demodulation signal from said second demodulating circuit under a received electric field intensity equal to or lower than a second level which is smaller than said first level.

3. A radio receiver for receiving a radio signal comprising:
    means receiving and converting said radio signal into an IF signal;
    a first demodulating circuit which is a pulse count demodulating circuit and a second demodulating circuit other than a pulse count demodulation circuit, both demodulating circuits being responsive to said IF signal;
    a detecting circuit for generating a field strength signal related to the received electric field intensity of said radio signal;
    a switching circuit selectively supplying a demodulation signal from said first demodulating circuit and a demodulation signal from said second demodulating circuit in response to said field strength signal;
    a noise elimination circuit for removing noises contained in one of said demodulating signals supplied from said switching circuit; and
    a noise elimination circuit controller responsive to the received electric field intensity to change the degree of the noise eliminating operation of said noise elimination circuit.

4. A radio receiver for receiving a radio signal comprising:
    means receiving and converting said radio signal into an IF signal;
    a first demodulating circuit which is a pulse count demodulating circuit and a second demodulating circuit other than a pulse count demodulating circuit, both demodulating circuits being responsive to said IF signal;
    a detecting circuit for generating a field strength signal related to the received electric field intensity of said radio signal;
    a switching circuit selectively supplying a demodulation signal from said first demodulating circuit or a demodulation signal from said second demodulating circuit in response to said field strength signal;
    a stereo demodulation circuit receiving a stereo demodulation signal which is one of said demodulation signals supplied from said switching circuit, to reproduce an L-channel signal and an R-channel signal from said stereo demodulation signal;
    a separation circuit responsive to said field strength signal to control the degree of channel separation of said stereo demodulation circuit;
    a high-cut circuit responsive to said field strength signal to attenuate high band components of said L-channel signal and R-channel signal supplied from said stereo demodulation circuit; and
    a separation/high-cut controller interrupting or minimizing operations of said high-cut circuit and separation circuit when said stereo demodulation signal supplied from said switching circuit is said demodulation signal from said first demodulating circuit.

* * * * *